(12) United States Patent
Lavelle

(10) Patent No.: US 11,520,066 B2
(45) Date of Patent: Dec. 6, 2022

(54) IONIZING RADIATION DETECTOR

(71) Applicant: The Johns Hopkins University, Baltimore, MD (US)

(72) Inventor: Christopher M. Lavelle, Sykesville, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 17/390,901

(22) Filed: Jul. 31, 2021

(65) Prior Publication Data

US 2022/0035057 A1 Feb. 3, 2022

Related U.S. Application Data

(60) Provisional application No. 63/158,935, filed on Mar. 10, 2021, provisional application No. 63/060,180, filed on Aug. 3, 2020.

(51) Int. Cl.
*G01T 1/24* (2006.01)
*G01T 1/208* (2006.01)
*G01T 1/20* (2006.01)

(52) U.S. Cl.
CPC .............. *G01T 1/248* (2013.01); *G01T 1/208* (2013.01); *G01T 1/2018* (2013.01)

(58) Field of Classification Search
CPC ....... G01T 1/248; G01T 1/2018; G01T 1/208; H01L 27/14601; H01L 27/14603
See application file for complete search history.

(56) References Cited

U.S. PATENT DOCUMENTS

| 10,697,829 | B2 | 6/2020 | Delic | |
|---|---|---|---|---|
| 2009/0315135 | A1* | 12/2009 | Finkelstein | ........... H01L 31/107 257/E31.113 |
| 2011/0241149 | A1* | 10/2011 | Mazzillo | ............... H01L 31/107 257/438 |
| 2019/0288026 | A1* | 9/2019 | Von Kaenel | ........ H01L 27/1463 |

OTHER PUBLICATIONS

C. M. Lavelle, et al., "Sensitivity of Silicon Photomultipliers to Direct Gamma Ray Irradiation," IEEE Transactions on Nuclear Science, vol. 67, No. 1, Jan. 2020, pp. 389-399.

* cited by examiner

*Primary Examiner* — David P Porta
*Assistant Examiner* — Mamadou Faye
(74) *Attorney, Agent, or Firm* — Noah J. Hayward

(57) ABSTRACT

An ionizing radiation detector includes a first common semiconductor substrate and a first plurality of single-photon avalanche diode (SPAD) microcell structures disposed at a top face of the first common semiconductor substrate. Each SPAD microcell structure includes a first semiconductor junction that is reverse-biased beyond a first breakdown threshold. The ionizing radiation detector may also include common anode and cathode connections to each of the SPAD microcell structures that operate as an output. The ionizing radiation detector may also include control circuitry connected to the SPAD microcell structures. The control circuitry may be configured to control biasing of the SPAD microcell structures and measure electrical characteristics of a signal provided on the output. Charge drift within the first common semiconductor substrate need not be inhibited from exciting more than one of the SPAD microcell structures of the first plurality of SPAD microcell structures by isolation barriers.

17 Claims, 12 Drawing Sheets

IONIZING RADIATION DETECTOR

CROSS-REFERENCE TO RELATED APPLICATIONS

This application claims priority to and the benefit of prior-filed, U.S. Provisional Application No. 63/060,180 filed on Aug. 3, 2020 and U.S. Provisional Application No. 63/158,935 filed on Mar. 10, 2021, the entire contents of both of which are incorporated by reference herein.

TECHNICAL FIELD

Exemplary embodiments of the present disclosure generally relate to electromagnetic detection systems. Further, many of the example embodiments provided herein more specifically relate to ionizing radiation detection technologies that leverage charge drift and visible light release generated by interactions with ionizing radiation.

BACKGROUND

The ability to detect ionizing radiation has proven to be a valuable in a number of different applications. For example, the detection of ionizing radiation or the presence of high energy particles has applications in nuclear physics research, and in industrial and medical procedures to name a few. Further, the detection of ionizing radiation emissions has also proven to be useful in national security contexts to identify the presence of, for example, nuclear weapons and dirty bombs that may emit such radiation.

Ionizing radiation, such as in the form of gamma rays, is the propagation of energy in the form of high energy photons or other sub-atomic particles. However, relative to visible light photons, photons of a gamma ray have significantly more energy. To detect gamma rays or the energy of the photons of a gamma ray, an ionizing radiation detector may be used. Examples of gamma ray detectors include spectrometers and imagers. Many conventional detectors measure how the gamma ray, and its photons, affect matter. A gamma ray photon passing through matter may collide with an electron and scatter in a different direction. Additionally, the collision with the electron or the formation of an ion may transfer energy, causing an electron to move or jump into a higher energy level within the atom. Such movement of the electron in this manner may be referred to a photoelectric ionization. Additionally, in some instances, the energy transfer that occurs may form a new electron or other particle. The formation of the new electron or other particle may be referred to as a pair production process. Regardless, the movement of the electron as a result of the ionization generates an electric current. This electric current may be amplified and measured. The measurement of the electric current can be used as a factor to estimate the energy in the photons of the received gamma ray.

Spectrometers and imagers rely upon the principals involved in ionization via, for example, photon-electron collision to perform detections. In optical astronomy applications, a photometer may be used for gamma ray detection. The photometer, like a spectrometer, operates as a light or photon collector. The photometer is directed and focused on an astronomical body to collect the photons originating from the body. The gamma ray photons may be transformed by the photometer using a scintillator to generate electrical signal that may be measured and recorded. Conventional imagers that are also referred to generally as detectors may more closely rely on the gamma ray interaction process associated with photon-electron collisions. In this regard, aspects related to the photon scattering and the pair production process may be measured.

Both of these approaches of ionizing radiation detection have certain complexities and drawbacks that, in some instances, make them difficult to construct and implement. As such, new approaches and improvements to the technologies leveraged for detection and measuring of gamma rays and other ionizing radiation are desired.

BRIEF SUMMARY

According to some example embodiments, an ionizing radiation detector is provided. The ionizing radiation detector may comprise a first common semiconductor substrate and a first plurality of single-photon avalanche diode (SPAD) microcell structures disposed at a top face of the first common semiconductor substrate. In this regard, each SPAD microcell structure of the first plurality of SPAD microcell structures may comprise a first semiconductor junction that is reverse-biased beyond a first breakdown threshold for the first semiconductor junction. The ionizing radiation detector may also comprise a common anode connection and a common cathode connection to each of the SPAD microcell structures of the first plurality of SPAD microcell structures. These connections may be configured to operate as an output for the first plurality of SPAD microcell structures. The ionizing radiation detector may also comprise control circuitry connected to the first plurality of SPAD microcell structures. The control circuitry may be configured to control biasing of the first plurality of SPAD microcell structures, and measure electrical characteristics of a signal provided on the output. According to some example embodiments, the charge drift within the first common semiconductor substrate need not be inhibited from exciting more than one of the SPAD microcell structures of the first plurality of SPAD microcell structures by isolation barriers.

Another example embodiment is a SPAD array for an ionizing radiation detector. The SPAD array may comprise a first common semiconductor substrate, and a first plurality of SPAD microcell structures disposed at a top face of the first common semiconductor substrate. Each SPAD microcell structure of the first plurality of SPAD microcell structures may comprise a first semiconductor junction that is reverse-biased beyond a first breakdown threshold for the first semiconductor junction. The SPAD array may further comprise a common anode connection and a common cathode connection to each of the SPAD microcell structure of the first plurality of SPAD microcell structures and configured to operate as an output for the SPAD array. Further, charge drift within the first common semiconductor substrate need not be inhibited from exciting more than one of the SPAD microcell structures of the first plurality of SPAD microcell structures by isolation barriers.

According to some example embodiments, an example method associated with operation of a ionizing radiation detector is also provided. In this regard, the example method may comprise controlling biasing of a first plurality of SPAD microcell structures disposed at a top face of a first common semiconductor substrate of an ionizing radiation detector. Each SPAD microcell structure of the first plurality of SPAD microcell structures may comprise a first semiconductor junction that is reverse-biased beyond a first breakdown threshold for the first semiconductor junction. The example method may also include receiving ionizing radiation at the ionizing radiation detector. Additionally, the example method may comprise permitting charge drift within a first common semiconductor substrate in response to receipt of ionizing radiation to excite one or more of the SPAD microcell structures of a first plurality of SPAD microcell structures. In this regard, the charge drift need not be inhibited from exciting more than one of SPAD microcell structures of a first plurality of SPAD microcell structures by isolation barriers. Further, the example method may comprise measuring electrical characteristics of a signal provided on a output of the first plurality of SPAD microcell structures. The output of the first plurality of SPAD microcell structures may comprise a common anode connection and a common cathode connection to each of the SPAD microcell structures of the first plurality of SPAD microcell structures.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
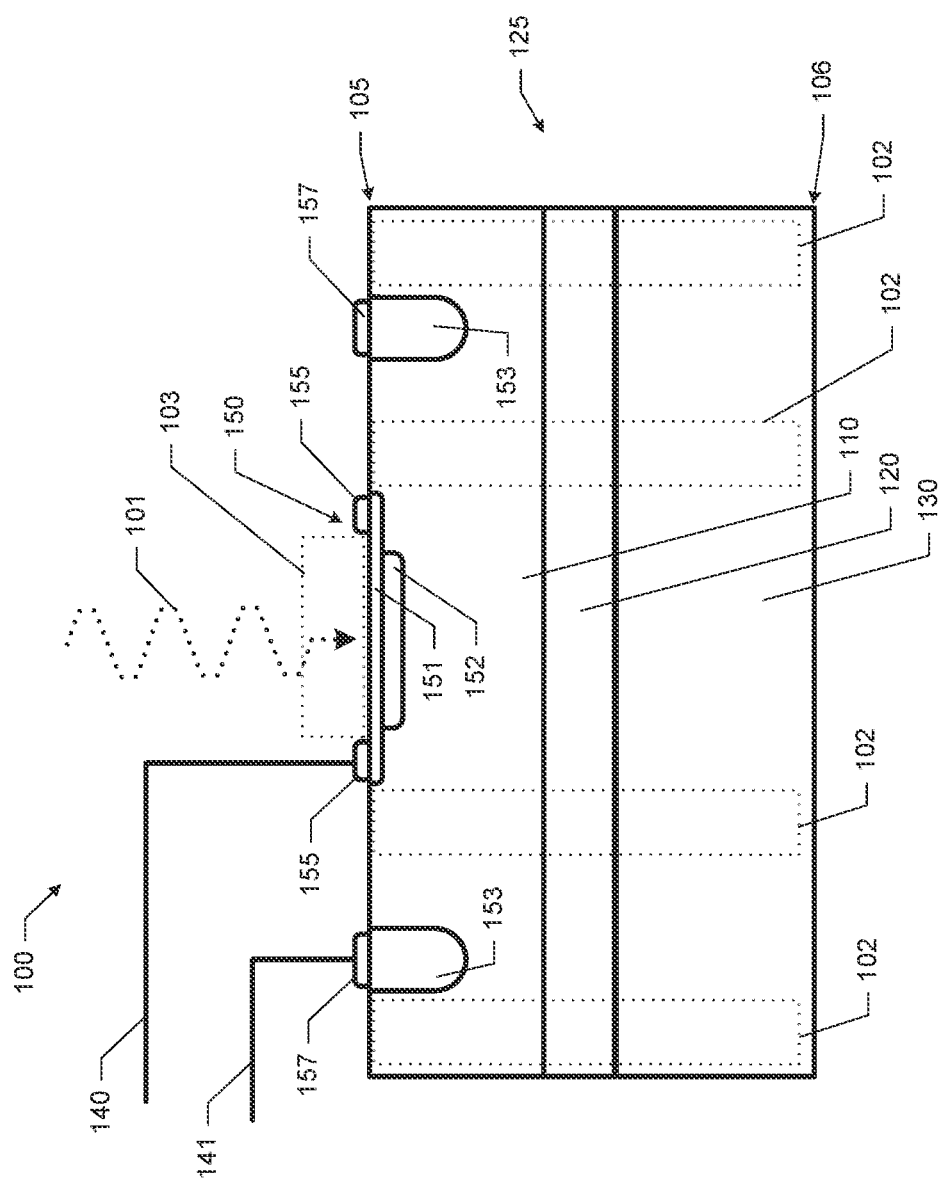
FIG. 1 illustrates an example detector element comprising a SPAD microcell structure and semiconductor substrate according to some example embodiments.

Some non-limiting, example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

According to some example embodiments, an ionizing radiation detector comprising a SPAD array and associated methods and systems are provided that leverage uninhibited charge drift and visible light that is released during a photon-electron collision or ionization event to obtain information regarding ionizing radiation. In many conventional systems, the charge drift between components and the output of visible light is considered a nuisance that is filtered or inhibited. Visible light, for example, has been treated in this manner because it was believed that the creation of visible light from a SPAD was so random and infrequent, and had such a low signal strength, that the light offered no useful information. In some instances, structures have been put in place to inhibit the charge drift (and the associated "crosstalk") that leads to the creation of visible light, and inhibit propagation of the visible light itself between structures. However, example embodiments described herein permit and encourage such charge drift and the resultant visible light and also operate to leverage the output signals associated with the charge drift and visible light to determine the occurrence of a receipt of ionizing radiation and estimated measurement of the energy of the ionizing radiation.

Ionizing radiation can induce electrical signals in a secondary medium. As such, these electrical signals can be leveraged in the context of scintillation and solid state detectors. Based on this foundation, example embodiments described herein can perform a new type of detection in the form of a spectroscopic (energy determination) and solid state detection. In this regard, electrons and muons may directly ionize a medium. Neutrons and gamma rays, which are electrically neutral, can also scatter charged particles (electrons and protons) which create the ionization.

According to some example embodiments, an ionizing radiation detector leveraging these principles may comprise, for example, a reverse-biased semiconductor junction (e.g., a PN junction) that may permit increased drift of charge carriers and emit visible light when interacting with ionizing radiation. The emission of the visible light can occur as a result of ionizing radiation causing a breakdown in the junction and is the result of interband gap electron transitions within the semiconductor (e.g., silicon) junction that can generate a measurable electrical signal. The output of visible light photons can be significant, for example, on the order of ten or more photons for an event, which may be leveraged for use in a detection and measurement process.

Following from the description above, when photons or particles within ionizing radiation, for example, in the form of a high-energy x-rays, gamma rays, interact with the semiconductor junction, charged particles may scatter. Because the photons or particles may be high energy, a large amount of high level band gap excitation may occur within the device due to is structure and biasing. As the device returns and becomes "de-excited," at least some of the energy is released in the form of visible light.

According to some example embodiments, the reverse-biased PN junction used to leverage this phenomenon may be implemented as a SPAD. The SPAD may be implemented to generate, as well as, register the detection of a visible light photon. As such, rather than being considered a nuisance, the emission of visible light may be encouraged and efforts may be taken to intentionally foster or increase the output of visible light to be used for detection and measuring of ionizing radiation. According to some example embodiments, the emission of visible light from the SPAD may increase as the size and area of the PN junction increases and the number of junctions increase.

According to some example embodiments, a solid-state single-photon-sensitive device may be constructed and leveraged as an ionizing radiation detector. As mentioned above, the ionizing radiation detector may utilize SPAD microcell structures in the construction of the ionizing radiation detector that allow for "crosstalk" between SPAD microcell structures both with respect to charge drift resulting from ionizing excitation and the creation of visible light photons.

To provide context, FIG. 1 illustrates a cross-section view of an example detector element 100 comprising a SPAD microcell structure 150 and semiconductor substrate 125 according to some example embodiments. As mentioned above, the detector element 100 comprises semiconductor materials that are specifically doped and biased to operate as a SPAD. In this regard, with respect to the semiconductor structure of the device, the detector element 100 may be constructed on a semiconductor wafer formed of, for example, silicon or other dopable semiconductor substance. In this regard, various doped regions or wells may be formed. For purposes of explanation, the detector element 100 may include a substrate portion, i.e., semiconductor substrate 125, and a SPAD microcell structure 150.

The structure of detector element 100 will now be described with the semiconductor junction being a PN junction with, generally speaking, a p-type well disposed in an n-type substrate. However, one of ordinary skill in the art would appreciate that, with some modifications, the junction could be constructed with an n-type well disposed within p-type substrate. Additionally, the detector element 100 may include a top surface 105 and a bottom surface 106.

In this regard, the SPAD microcell structure may be constructed within the semiconductor substrate 125. Describing from the bottom layers upward, the semiconductor substrate 125 may comprise a substrate layer 130 that, according to some example embodiments, may be doped n+. Above the substrate layer 130, a buried layer 120 may be formed that is doped p+. Additionally, above the buried layer 120, a quasi-intrinsic layer 110 may be formed, that may be doped p−.

Within the quasi-intrinsic layer 110, a number of wells having different dopings may be formed. In this regard, an enrichment well 152 may be formed within the quasi-intrinsic layer 110 above, but not in contact with, the buried layer 120. The enrichment well 152 may be doped p. A shallow well 151 may be formed at the top surface 105 of the detector element 100 and the at the top of the quasi-intrinsic layer 110. The shallow well 151 may be formed between the enrichment well 152 and the top surface 105 of the detector element 100. The shallow well 151 may be doped n+. Additionally, a sinker well 153 may be formed in the quasi-intrinsic layer 110. According to some example embodiments, the sinker well 153 may be formed at the top surface 105 of the detector element 100 and may extend down into the quasi-intrinsic layer 110. The sinker well 153 may be spaced away from the shallow well 151 and the enrichment well 152 such that some portion of the quasi-intrinsic layer 110 is disposed between the sinker well 153 and the shallow well 151 and between the sinker well 153 and the enrichment well 152. According to some example embodiments, the sinker well 153 may surround the shallow well 151 and the enrichment well 152 having a ring-shape. According to some example embodiments, the sinker well 153 may not extend out of the quasi-intrinsic layer 110, and for example, into the buried layer 120. However, according to some example embodiments, the sinker well 153 may extend beyond the quasi-intrinsic layer 110 and into the buried layer 120. According to some example embodiments, the sinker well 153 may be doped p+.

To operate the detector element 100 as a diode, connections may be defined for biasing the device. In this regard, a cathode contact 155 may be disposed in electrical and physical connection with the shallow well 151. According to some example embodiments, the cathode contact 155 may be electrically connected to a cathode lead 140 which may be connected to external circuitry (e.g., control circuitry 610 of FIG. 9) to control and monitor the detector element 100. Additionally, an anode contact 157 may be disposed in electrical and physical connection with the sinker well 153. According to some example embodiments, the anode contact 157 may be electrically connected to an anode lead 141 which may also be connected to external circuitry (e.g., control circuitry 610 of FIG. 9) to control and monitor the detector element 100.

In operation, the detector element 100 may be biased by applying a voltage to the cathode lead 140 and the anode lead 141. To operate as a SPAD, a reverse bias may be applied to the detector element 100. In this regard, a higher potential may be applied to the cathode lead 140 relative to the anode lead 141 to create a reverse bias. Due to the example structure of the detector element 100, a reverse bias voltage may be defined where the semiconductor junction breaks down. To operate as a SPAD, the reverse biasing of the detector element 100 may be greater than the breakdown voltage of the semiconductor junction. Operating as a SPAD may enable an ability of the device to receive and detect ionizing radiation 101 as further described herein.

One of ordinary skill in the art would appreciate that the structure described with respect to the detector element 100 of FIG. 1 is but one example of a detector element that may be operated as a SPAD. Certainly other structural and doping configurations are contemplated. Further, it can be seen that the semiconductor substrate 125 may be a collection of doped layers of semiconductor material that can extend across the entire element or multiple elements. In this regard, the semiconductor substrate 125 may comprise the substrate layer 130, the buried layer 120, and the quasi-intrinsic layer 110. The features of the detector element 100 that may be specific to an individual detector element may be the SPAD microcell structure 150, which may include features that are not shared with other detector elements. In this regard, an SPAD microcell structure 150 may comprise the shallow well 151, the enrichment well 152, the sinker well 153, the cathode contact 155, and the anode contact 157. According to some example embodiments, the SPAD microcell structure 150 may comprise the elements necessary for individual operation as an SPAD, sometimes referred merely as a microcell. The features of the SPAD microcell structure 150 may be disposed in a patterned fashion on, for example, a semiconductor wafer that is subjected to a doping and fabrication process to form the layers of the semiconductor substrate 125 and the features of the SPAD microcell structure 150.

In operation, the detector element 100 may be configured to receive and react to interactions with ionizing radiation 101. Such ionizing radiation may take a number of different forms including, for example, gamma rays, high energy x-rays, alpha particles, beta particles, and neutrons. Such radiation types may interact with the detector element 100 to cause an electron collision or formation of an ion, as mentioned above. Because the detector element 100 is a SPAD, the occurrence may cause an electrical current due to charge carrier drift that, as a result of the reverse biasing, continues to increase in an avalanche effect. Many electrons and/or holes can continue to become excited causing an increasing charge drift within the semiconductor substrate 125. This increasing charge drift may manifest as a pulse, and repeated interaction with ionizing radiation may lead to series of pulses on the output (i.e., the anode lead 141 and the cathode lead 140). Such pulsing may be monitored (e.g., measured or detected in an binary fashion) and, if directed to a sounder device, may operate as a Geiger counter-type device.

Additionally, the process of the charge drift may also lead to energy being released from the detector element 100 and the SPAD microcell structure 150 in the form of visible light. In this regard, visible light photons may be created and released from the SPAD microcell structure 150. As further described below, this outputting of visible light photons may be used to excite adjacent and nearby the SPAD microcell structures that are connected in parallel, thereby amplifying the signal generated by the SPAD microcell structure 150 for more reliable detection.

As further described below, the detector element 100 may include an absence of certain features or elements that may be implemented in other SPADs, according to some example embodiments. In this regard, some SPADs may include features specifically configured to inhibit charge drift from propagating to neighboring SPADs to avoid "crosstalk" between the SPADs. Such features may be disposed in locations 102. For example, isolation barriers may be disposed between the shallow well 151/enrichment well 152 and the sinker well 153. Additionally or alternatively, the isolation barriers may be disposed on an opposite side of the sinker well 153 from the shallow well 151/enrichment well 152. The isolation barriers, which may be referred to as trenches, may be doped wells that extend deep into the semiconductor substrate (e.g., into the substrate layer 130). Alternatively, such isolation barriers may be formed of an oxide and/or a polysilicon. Because, according to some example embodiments, these isolation barriers would tend reduce the distance of charge drift by block further charge drift and thereby prevent the excitation of neighboring SPADs, such isolation barriers need not be included since, according to some example embodiments, increased charge drift and such crosstalk is desired.

Additionally, some SPADs include a window at 103 (e.g., above the shallow well 151) that may be formed of a reflective or semi-reflective material. Such window may be included to limit the amount of visible light photons that may escape from the SPAD and excited neighboring SPADs. The window may be formed of glass or even a grease applied to the top surface 105 above the shallow well 151 to retain and prevent propagation of visible light emitted from the SPAD. However, since, according to some example embodiments, crosstalk of visible light photons is encouraged, according to some example embodiments, the detector element 100 need not include a window element to restrain or inhibit propagation of visible light.

However, in some example embodiments, a window may be provided at 103 that is reflective (e.g., where a facing SPAD array is not present as shown in FIGS. 5-9). Such a window may be implemented to reflect visible light generated by the detector element 100 back into the SPAD microcell structure 150 to further excite the SPAD microcell structure 150 and increase the magnitude of a pulse generated on the cathode lead 140 relative to the anode lead 141.

In this regard, the magnitude of the pulse may have a proportional relationship to the energy present in the ionizing radiation 101.

Figure 2:
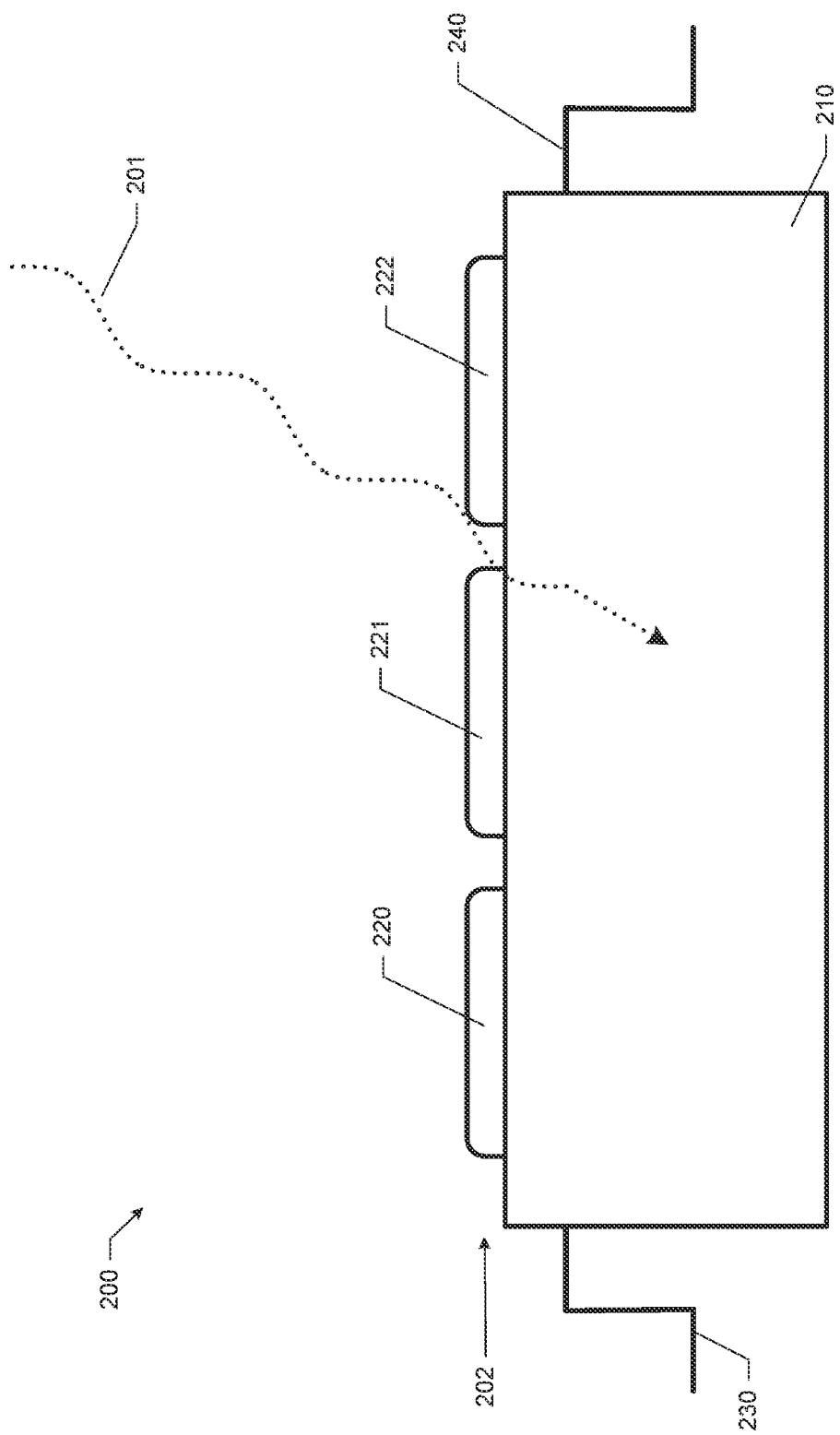
FIG. 2 illustrates an example SPAD array receiving ionizing radiation according to some example embodiments.
Figure 3:
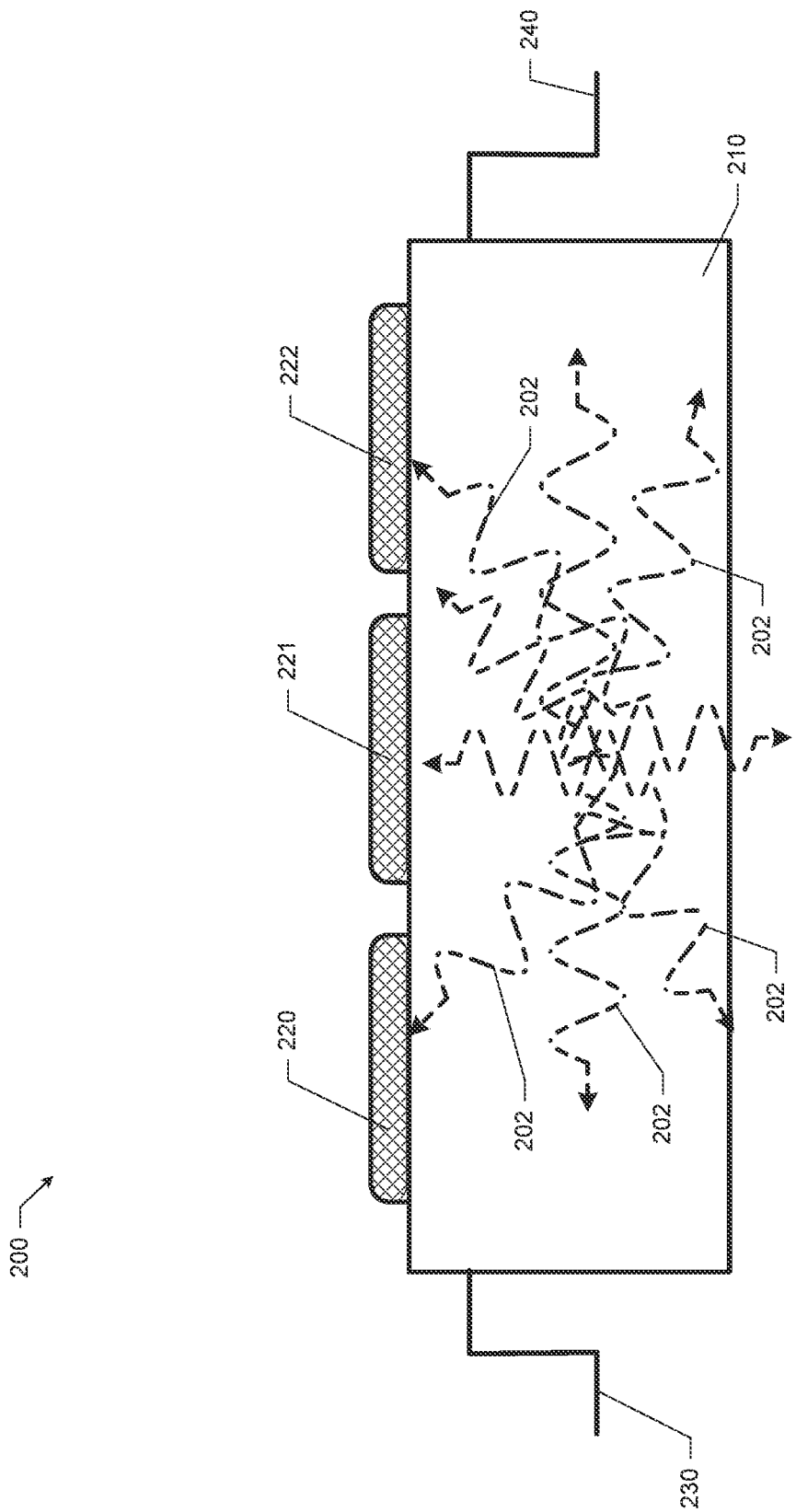
FIG. 3 illustrates an example SPAD array having receiving ionizing radiation resulting in charge drift within the substrate according to some example embodiments.
Figure 4:
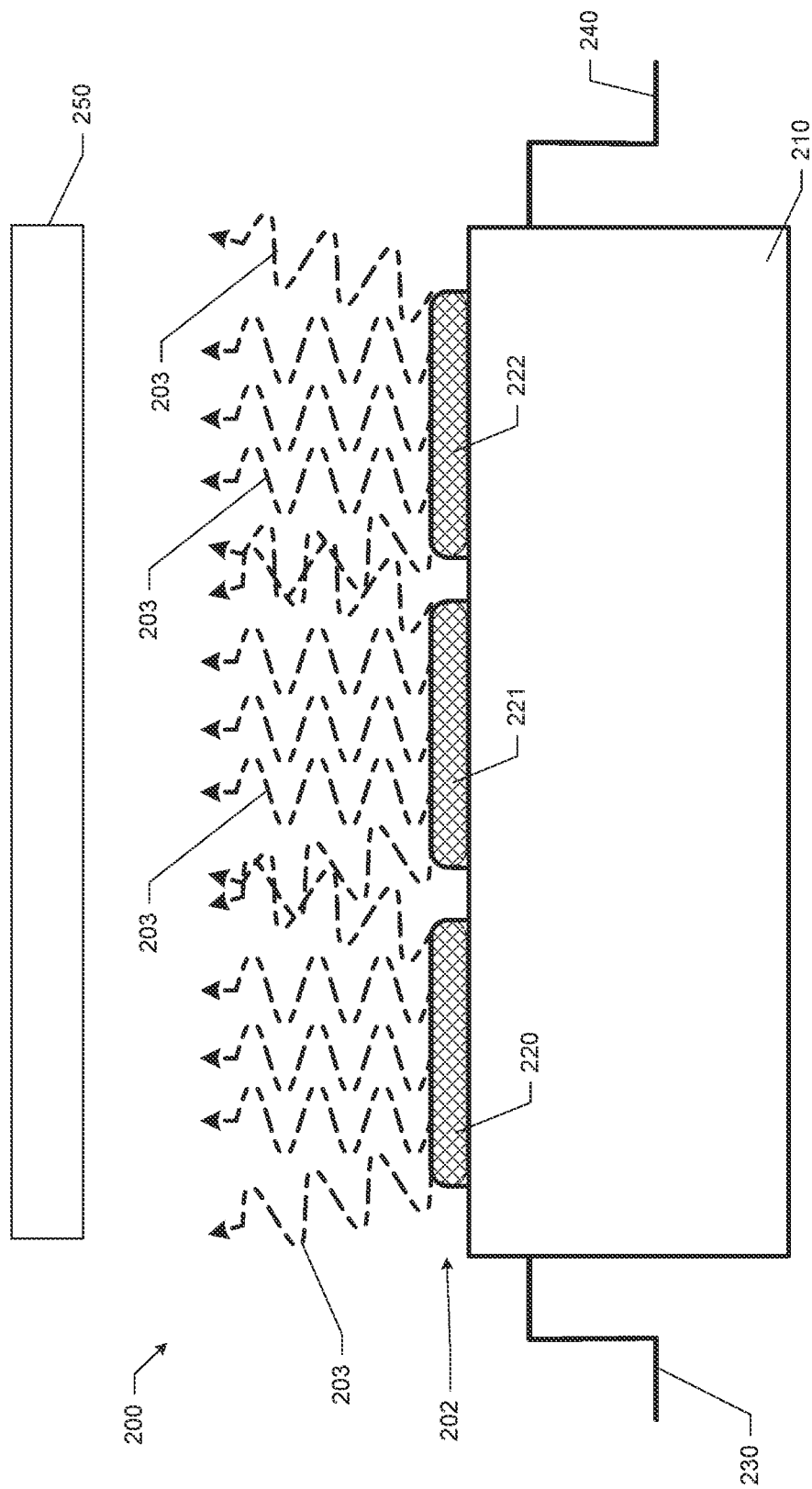
FIG. 4 illustrates an example SPAD array with excited SPAD microcell structures outputting visible light according to some example embodiments.

FIGS. 2-4 will now be described which illustrate an SPAD array 200 according to some example embodiments. The SPAD array 200 may include a plurality of detector elements (and associated SPAD microcell structures) that share a common semiconductor substrate 210. However, it is understood that any number of detector elements may be formed with a common semiconductor substrate 210 (e.g., thousands of detector elements may be constructed per square millimeter at a microscopic scale). According to some example embodiments, the common semiconductor substrate 210 may be constructed in same or similar manner as the semiconductor substrate 125. As shown in FIGS. 2-4, the SPAD array 200 may include three SPAD microcell structures 220, 221, and 222. The SPAD microcell structures 220, 221, and 222 may be constructed in the same or similar manner as the SPAD microcell structure 150 and constructed with the common semiconductor substrate 210. The SPAD microcell structures 220, 221, and 222 are shown above a top surface of the common semiconductor substrate 210, but it is understood that the features of the SPAD microcell structures 220, 221, and 222 may be disposed within the common semiconductor substrate 210, similar to the SPAD microcell structure 150. Additionally, for ease of explanation, a common anode connection 230 is shown. However, each anode contact for the SPAD microcell structures 220, 221, and 222 are connected to form the common anode connection 230. Also for ease of explanation, a common cathode connection 240 is shown. However, each cathode contact for the SPAD microcell structures 220, 221, and 222 are connected to form the common cathode connection 240. Accordingly, the SPAD microcell structures 220, 221, and 222 may be connected in parallel such that the signals generated by each may be additive.

Based on the structure of the SPAD array 200, the operation of the SPAD array 200 will now be described. In this regard, with reference to FIG. 2, ionizing radiation may be received into the SPAD array 200. Due to the wavelength of the ionizing radiation, the ionizing radiation may propagate through the SPAD array 200 until a ionization event occurs.

As shown in FIG. 3, an ionization event resulting in a charge drift may be triggered by ionization leading to an avalanche effect with carriers 202 moving within the common semiconductor substrate 210. Even though the ionization may have occurred below the SPAD microcell structure 221, because, for example, no isolation barriers are present in the common semiconductor substrate 210, the carriers 202 may drift or move into position to excite the neighboring SPAD microcell structures 220 and 222. One or more the carriers 202 may interact with the SPAD microcell structures 220, 221, and 222 to excite the SPAD microcell structures 220, 221, and 222 (indicated by the cross-hatched appearance of the SPAD microcell structures 220, 221, and 222. Accordingly, due to the excited SPAD microcell structures 220, 221, and 222, an electric pulse may be generated on the anode connection 230 and the cathode connection 240 (i.e., the output) for detection by, for example, control circuitry.

In addition to generating the output pulse, the excited SPAD microcell structures 220, 221, and 222 may also release visible light. As shown in FIG. 4, the excited SPAD microcell structures 220, 221, and 222 may generate visible light photons 203. The visible light photons may propagate away from a top surface of the SPAD microcell structures 220, 221, and 222. As such, the direction and orientation of the SPAD microcell structures 220, 221, and 222 may dictate the direction of propagation of the visible light photons generated by the excited SPAD microcell structures 220, 221, and 222. According to some example embodiments, a visible light detector 250 may be positioned above the SPAD microcell structures 220, 221, and 222 to receive and measure the visible light. Additionally, an output signal of the visible light detector 250 may be evaluated by, for example, processing circuitry (e.g. control circuitry 610) to determine an estimate of the energy of the original ionizing radiation 201, due to a proportionality relationship between the detected energy of the visible light and the energy of the original ionizing radiation.

Figure 5:
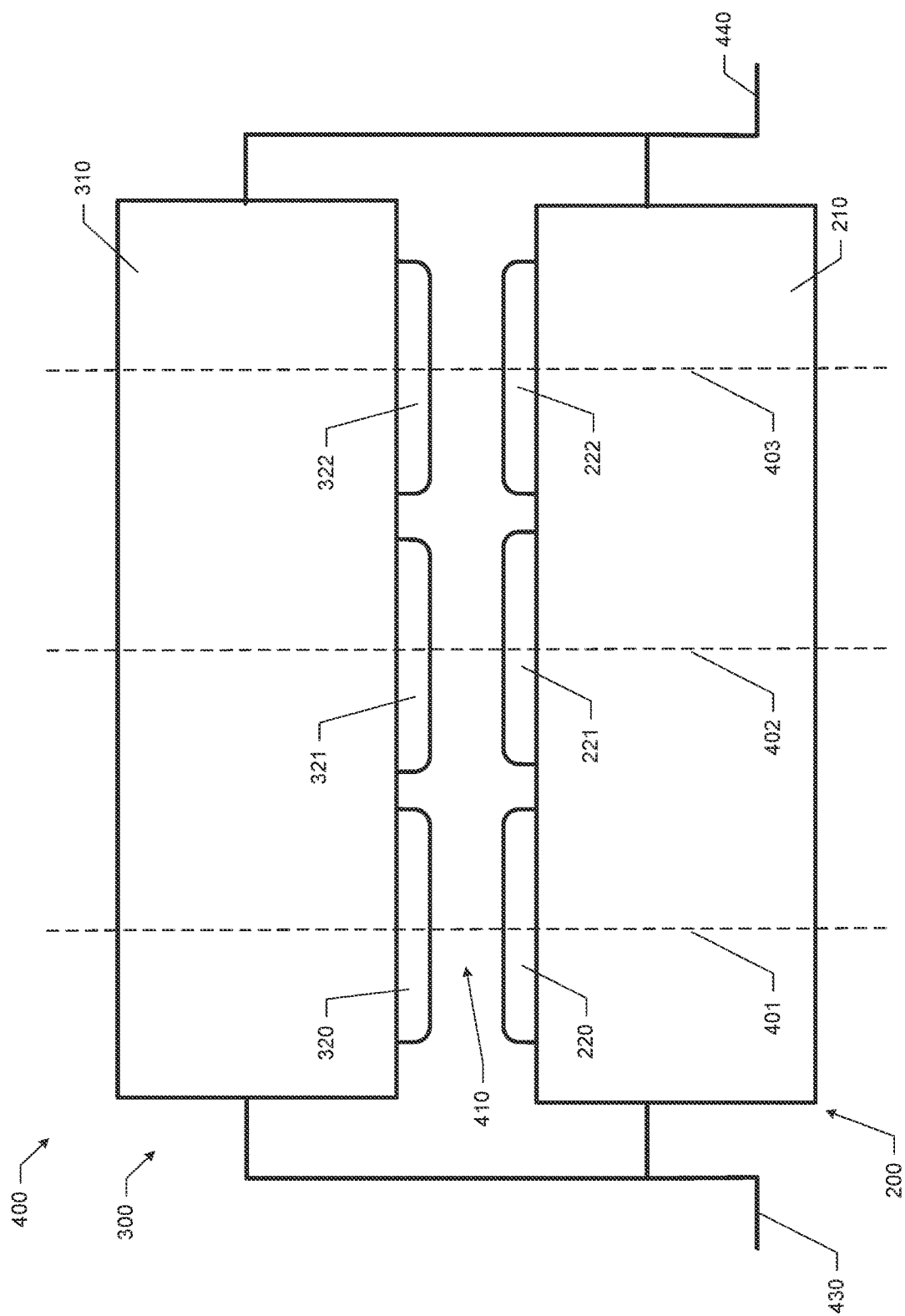
FIG. 5 illustrates a SPAD array with facing SPAD microcell structures according to some example embodiments.

Now referring to FIG. 5, another example embodiment is described involves capture of the emitted light from a first group of detector elements by a second group of detector elements to increase the output signal that is generated based on the initial ionizing radiation. According to some example embodiments, a SPAD array 400 may be constructed where at least some of the SPAD microcell structures are facing each other, such that visible light emitted from a SPAD microcell structure may be received and cause excitation of another SPAD microcell structure.

As shown in FIG. 5, the first SPAD array 200 is shown in a lower position (below) and may otherwise be configured as described with respect to FIGS. 2-4. However, a second SPAD array 300 (or sub-array) may be included that is oriented in an inverted position relative to the first SPAD array 200 (or sub-array). As such, the first SPAD array 200 may be said to face in a first direction, while the second SPAD array 300 may be positioned to face in a second direction that is opposite the first direction, where the SPAD array 200 faces the SPAD array 300. Since the SPAD array 200 and the SPAD array 300 face each other, a gap may be formed between the arrays, which may be referred to as the visible light propagation gap 410. According to some example embodiments, the visible light propagation gap 410 may merely be an air gap or, according to some example embodiments, a substance such as an optical grease may be disposed within the visible light propagation gap 410 to further encourage the propagation of the light between the facing SPAD microcell structures.

In this regard, the SPAD array 300 may be structurally the same or similar to the SPAD array 200. As such, the SPAD array 300 may comprise a common semiconductor substrate 310 and SPAD microcell structures 320, 321, and 322. Additionally, the common anode connections of the first SPAD array 200 and the second SPAD array 300 may be connected to form a common anode connection 430 and a common cathode connections of the first SPAD array 200 and the second SPAD array 400 may be connected to form a common cathode connection 440. As such, all of the detector elements and SPAD microcell structures of the SPAD array 200 and the SPAD array 300 may be electrically connected in parallel.

According to some example embodiments, the SPAD microcell structures 320, 321, and 322 may be facing the SPAD microcell structures 220, 221, and 222 such that the centers of the structures are aligned (i.e., SPAD microcell structure 320 may be directly above SPAD microcell structure 220 as indicated by reference 401, SPAD microcell structure 321 may be directly above SPAD microcell structure 221 as indicated by reference 402, and SPAD microcell structure 322 may be directly above SPAD microcell structure 222 as indicated by reference 403). Although FIG. 5 provides a two dimensional side view of the SPAD array 400, it is understood that the centers of the SPAD microcell structures may also be aligned in a third dimension.

Figure 6:
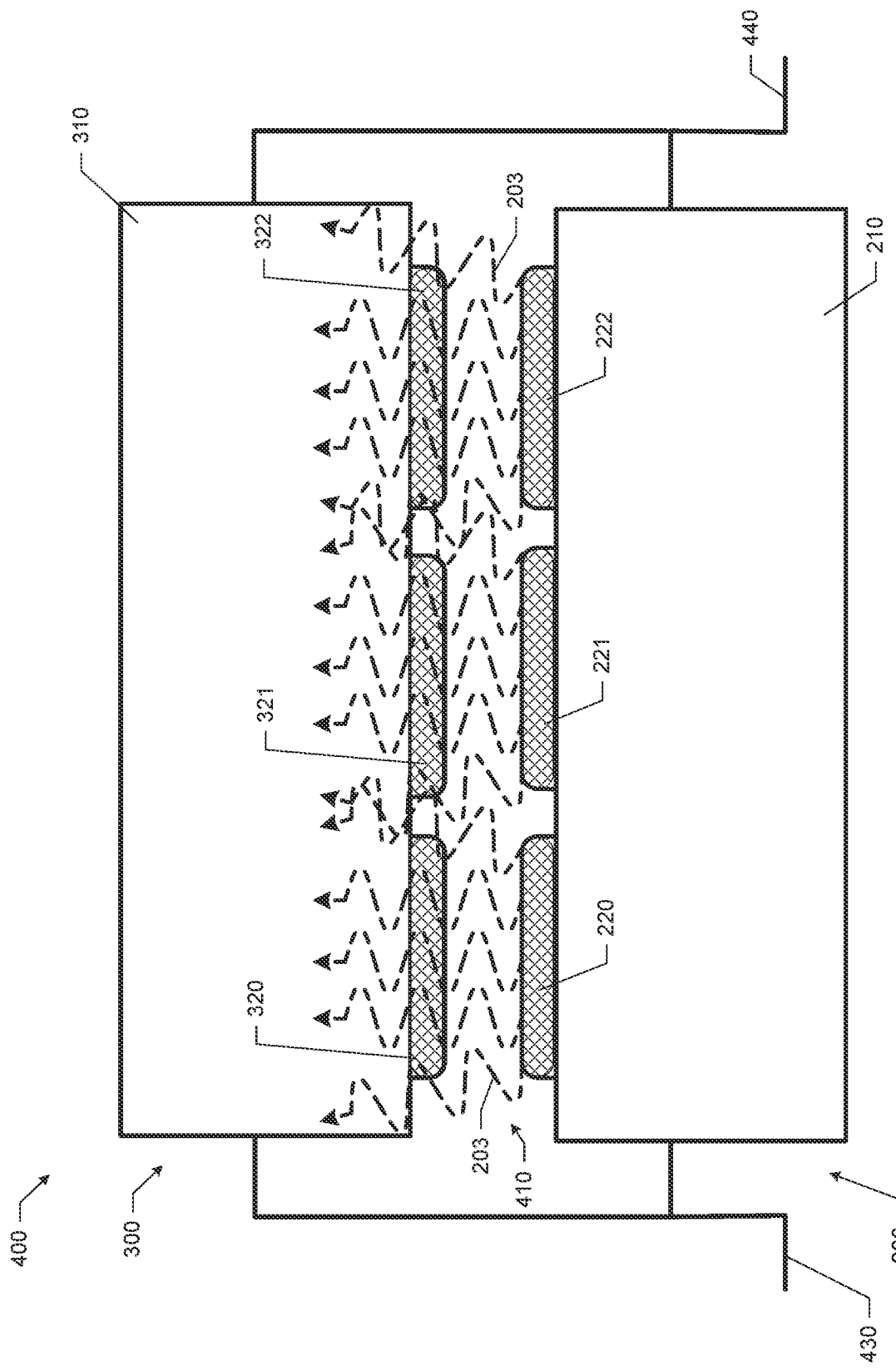
FIG. 6 illustrates a SPAD array with facing SPAD microcell structures that are excited according to some example embodiments.

FIG. 6 illustrates the functional effect of having facing SPAD microcell structures according to some example embodiments. In FIG. 6, the excitation of SPAD microcell structures 220, 221, and 222 has occurred, thereby generating that visible light photons 203. The photon 203 are emitted from the SPAD microcell structures 220, 221, and 222, propagate through the visible light propagation gap 410, and are received by the facing SPAD microcell structures 320, 321, and 322. Accordingly, the SPAD microcell structures 320, 321, and 322 also enter into an excited state (as indicated by the cross hatching) and therefore contribute to a pulse signal output that is generated on the common anode and cathode connections. As such, the output signal, due to the emission of the visible light, may be readably measureable by measurement circuitry.

Figure 7:
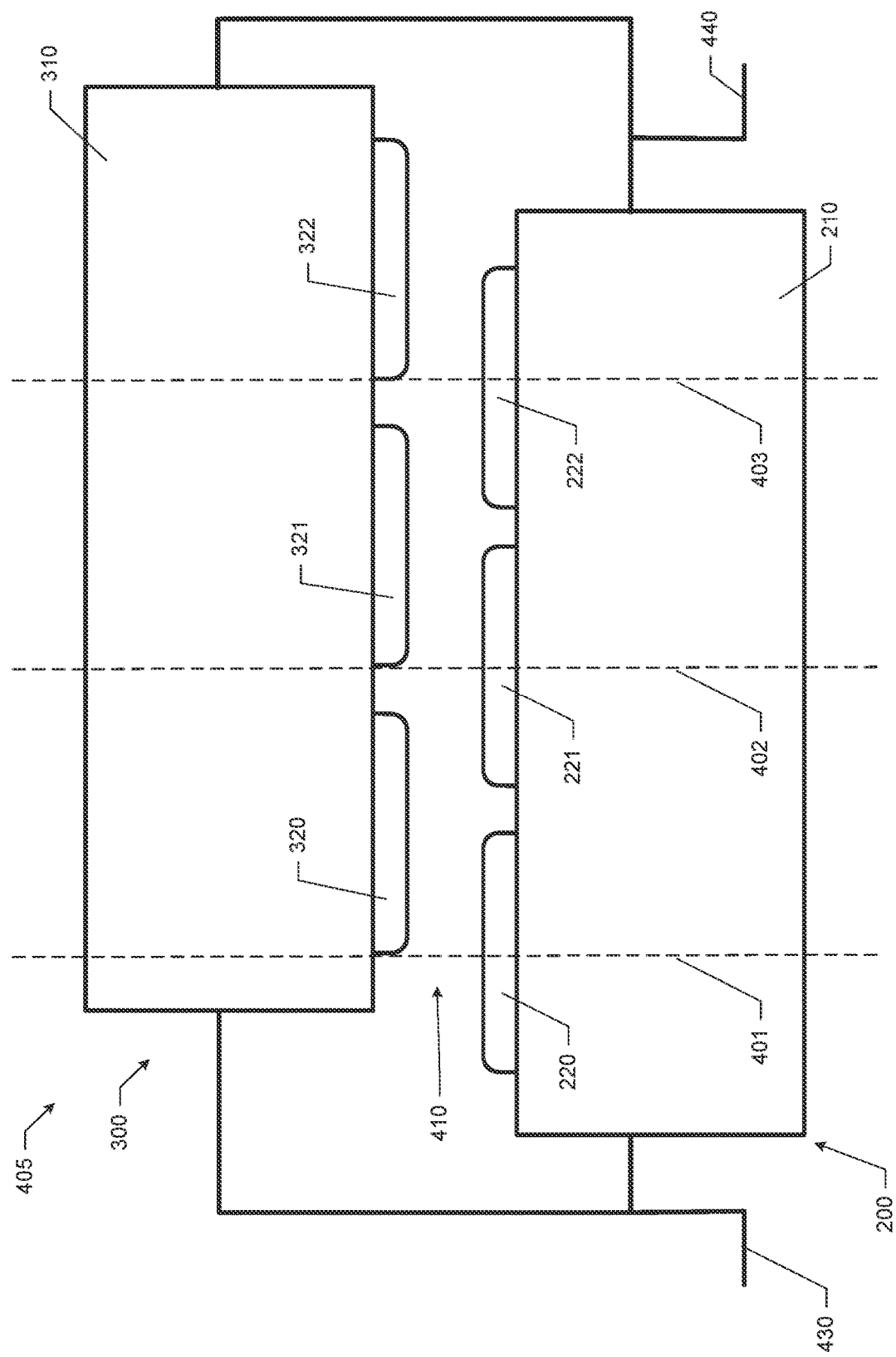
FIG. 7 illustrates a SPAD array with facing SPAD microcell structures that are positionally offset according to some example embodiments.

Now referencing FIG. 7, according to some example embodiments, another variation of the SPAD array 400 is shown as offset SPAD array 495. In this regard, the SPAD microcell structures need not be aligned as provided in the SPAD array 405. For example, the SPAD microcell structures of the SPAD array 200 (lower array) may be positionally offset in at least one dimension from the SPAD microcell structures of the SPAD array 300. For example, the offset distance may be half of a length or width of the top surface central well (e.g., the shallow well) such that an SPAD microcell structure is centered at a location that overlaps more than one SPAD microcell structure of the facing SPAD array. Other offsets may alternatively be implemented. As such, with reference to FIG. 5B, the SPAD microcell structure 320 may overlap with SPAD microcell structure 220 and SPAD microcell structure 221, the SPAD microcell structure 321 may overlap with SPAD microcell structure 221 and SPAD microcell structure 222, and finally the SPAD microcell structure 322 may overlap with SPAD microcell structure 222 and need not overlap another SPAD microcell structure due to being disposed at an end position. Additionally, it is understood that the SPAD microcell structures may also be offset in a third dimension such that, for example, some of the SPAD microcell structures may overlap, for example, four different SPAD microcell structures on the facing SPAD array. Another alternative, is that the SPAD microcell structure on the same SPAD array that shares a common semiconductor substrate may also be offset relative to each other within the same plane of the top surface of the common semiconductor substrate (e.g., offset rows or columns). With these offsets in place the collection of visible light photons between the SPAD microcell structures may, at least in some instances, be increased due to additional SPAD microcell structures being excited by the generation of the visible light, which may also increase the output signal on the common anode connection 430 and the common cathode connection 440.

While planar configurations of facing SPAD microcell structures within an array are shown in the figures, it is contemplated that other configurations and orientations of facing SPAD microcell structures may be constructed to detect visible light emissions. For example, the SPAD microcell structures may be oriented in a manner such that each SPAD microcell structure in a group faces the center of a circle. In this manner, the SPAD microcell structures may be disposed at a given distance (radius) around a circumference of a circle. Such a configuration may be further defined in three dimensions such that the SPAD microcell structures form the internal surface of a sphere at a given radius and are each faced toward the center of the sphere.

Alternative, such a circular configuration may be extended in a third dimension such that the SPAD microcell structures are disposed on the internal surface of a cylinder with rows of aligned or offset SPAD microcell structures. Alternatively, the SPAD microcell structures may face each other by being positioned on an interior of a rectangular shape (e.g., square). Similarly, SPAD microcell structures may be disposed on the interior faces of a cube or other three-dimensional rectangular shape.

Figure 8:
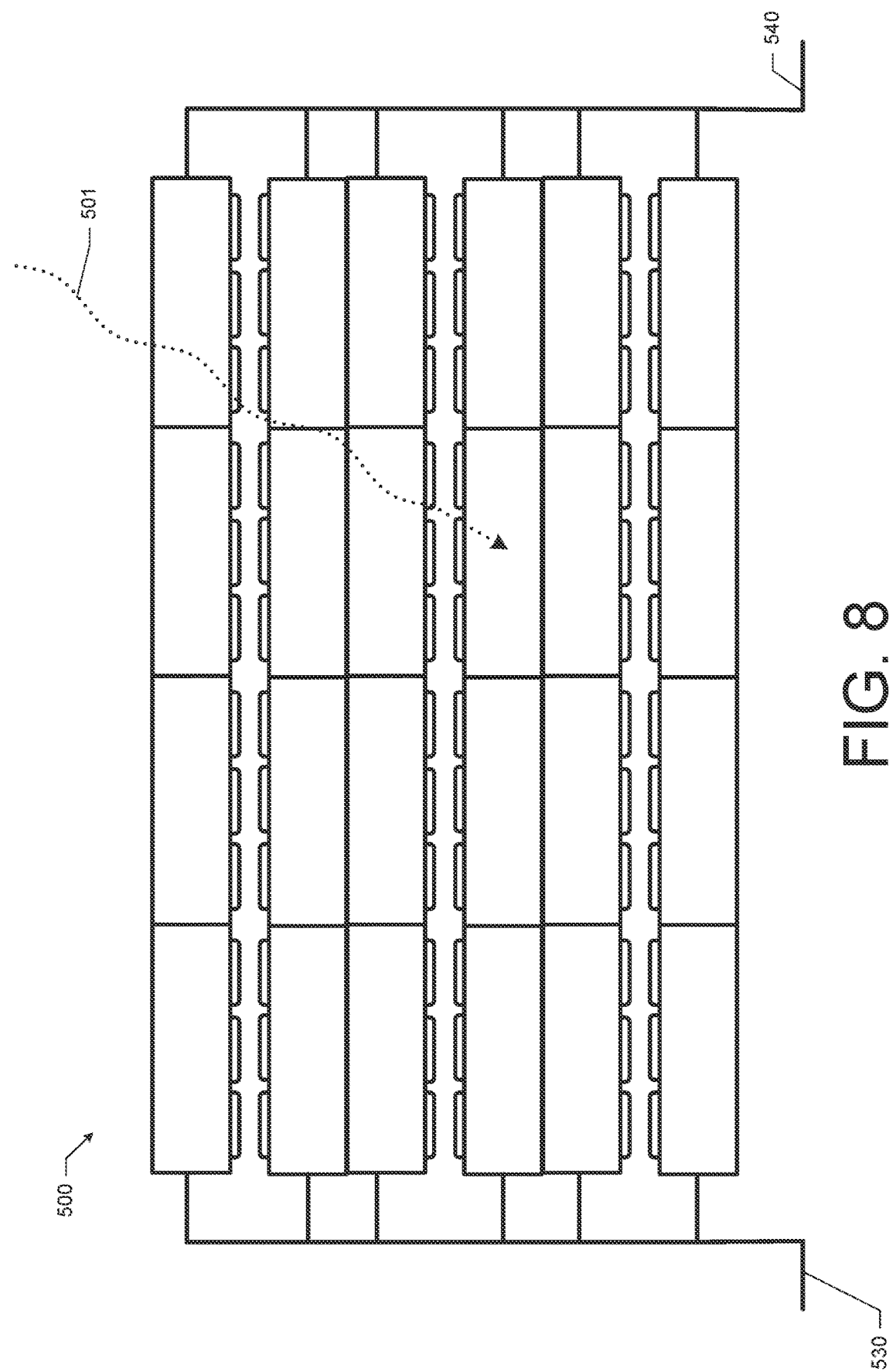
FIG. 8 illustrates a multi-layer SPAD array with multiple rows of facing SPAD microcell structures according to some example embodiments.

Building on concepts described above, a multi-row SPAD array 500 is shown in FIG. 8. The example SPAD array 500 includes six facing rows of SPAD microcell structures forming an SPAD array matrix. In this regard, each row may include twelve SPAD microcell structures facing twelve other SPAD microcell structures. The common semiconductor substrate for one side of facing rows may be continuous or separated. Between the facing rows, the common semiconductor substrate may abut each other due to the substrates being separate, or a semiconductor substrate may be constructed that supports both a top and bottom set of SPAD microcell structures. Again the anode leads from each detector element may be electrically connected and the cathode leads from each detector element may be electrically connected. As such, the detector elements of the SPAD array 500 may all be connected in parallel having a common anode connection 530 and a common cathode connection 540.

Figure 9:
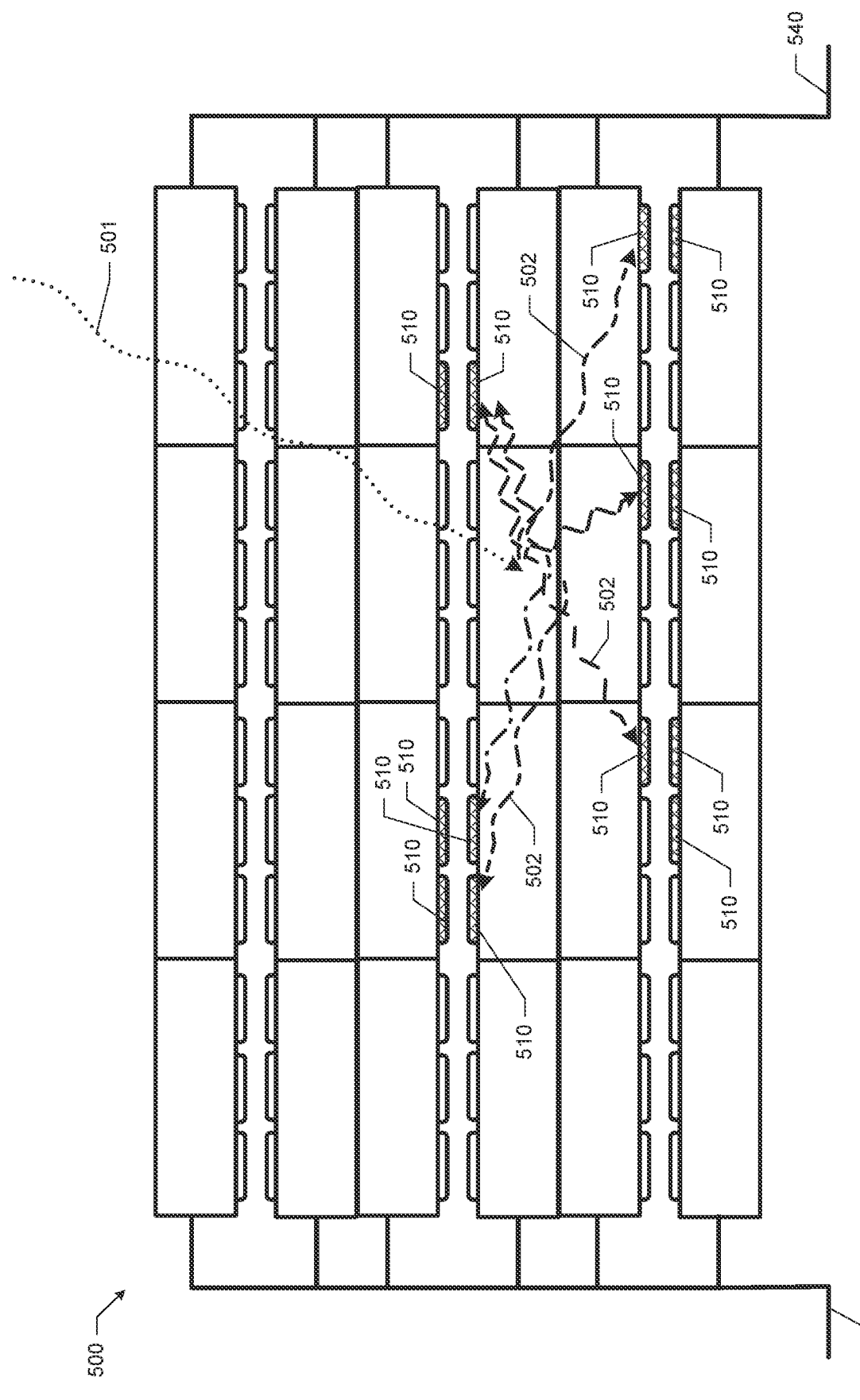
FIG. 9 illustrates a multi-layer SPAD array with multiple rows of facing SPAD microcell structures with some excited SPAD microcell structures according to some example embodiments.

The SPAD array 500 may operate similarly to the SPAD array 400 described above. However, due to the increased number of rows of SPAD microcell structures, the likelihood of ionizing radiation causing one or more ionization events and resultant visible light photons is increased. As shown in FIG. 8, ionizing radiation 501 may penetrate into the SPAD array 500. When ionization occurs, as shown in FIG. 9, the resultant charge drift may propagate to SPAD microcell structures on different rows. As such, an increased number of SPAD microcell structures may be excited due to the increased options for interacting with the charge drift. Additionally, the visible light that is generated may also operate to excite additional SPAD microcell structures as indicated by the excited SPAD microcell structures 510. Accordingly, the output signal in the form of a pulse may have a larger magnitude due to the increased number of excited SPAD microcell structures for the SPAD array 500. Further, a proportional relationship may exist between the number of excited SPAD microcell structures and the magnitude of the output signal, and this relationship may be leveraged to, for example, estimate the energy of the received ionizing radiation.

Figure 10:
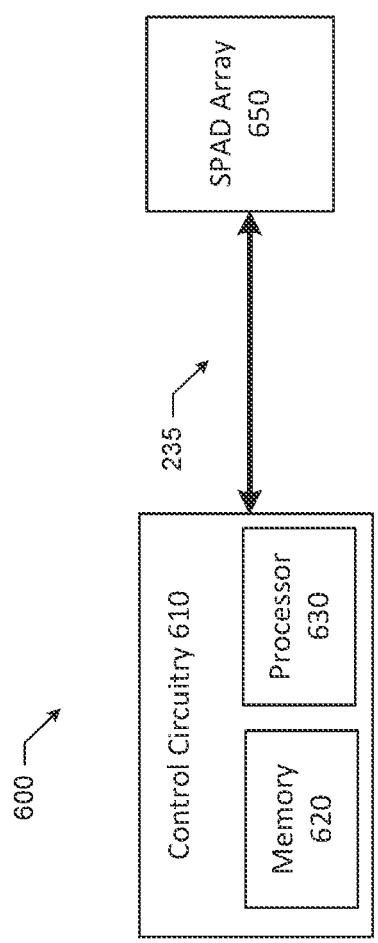
FIG. 10 illustrates a block diagram of an ionizing radiation detector according to some example embodiments.

Now referring to FIG. 10, a block diagram of an example ionizing radiation detector 600 is provided. The SPAD array 650 may be any of the SPAD arrays described herein and variations thereof. The control circuitry 610 may be configured to control the operation of the SPAD array 650 via the common anode and cathode connections. Further, the control circuitry 610 may be configured to monitor and measure signals generated on the common anode and cathode connections operating as an output to the SPAD array 650.

The control circuitry 610 may be in operative communication with or embody, a memory 620 and the processor 630, a user interface (not shown), and a communications interface 235. Additionally, control circuitry 610 may include additional components not shown in FIG. 10 that may be operably coupled to control circuitry 610. For example, a wired or wireless communications interface, and/or the user interface (input and output devices) may be operably coupled to the control circuitry 610. Additionally, amplifiers, filters, and other signal conditioning elements (e.g., resistors, capacitors, etc.) may be operably coupled to the control circuitry 610 to facilitate receipt and processing of the output signals provided by the SPAD array 650. Through configuration and operation of the memory 620 and the processor 630, the control circuitry 610 may perform various operations as described herein, including the operations and functionalities described with respect to control and monitoring of the SPAD array 650. In this regard, the control circuitry 610 may be configured to perform computational processing, memory management, control, and monitoring. In some embodiments, the control circuitry 610 may be embodied as a chip or chip set. In other words, the control circuitry 610 may comprise one or more physical packages (e.g., chips) including materials, components or wires on a structural assembly (e.g., a baseboard). The control circuitry 610 may be configured to receive inputs (e.g., via peripheral components), perform actions based on the inputs, and generate outputs (e.g., for provision to peripheral components). In an example embodiment, the control circuitry 610 may include one or more instances of a processor 630, associated circuitry, and memory 620. As such, the control circuitry 610 may be embodied as a circuit chip [e.g., an integrated circuit chip, such as a field programmable gate array (FPGA)] configured (e.g., with hardware, software or a combination of hardware and software) to perform operations described herein.

In an example embodiment, the memory 620 may include one or more non-transitory memory devices such as, for example, volatile or non-volatile memory that may be either fixed or removable. The memory 620 may be configured to store information, data, applications, instructions, or the like for enabling, for example, the functionalities described with respect to control and monitoring of the SPAD array 650. The memory 620 may operate to buffer instructions and data during operation of the control circuitry 610 to support higher-level functionalities, and may also be configured to store instructions for execution by the control circuitry 610. The memory 620 may also store various information including biasing procedures for the SPAD array 650. According to some example embodiments, various data stored in the memory 620 may be generated based on other data to generate computational results and estimates based on, for example, data from signals received as an output of the SPAD array 650.

As mentioned above, the control circuitry 610 may be embodied in a number of different ways. For example, the control circuitry 610 may be embodied as various processing means such as one or more processors 630 that may be in the form of a microprocessor or other processing element, a coprocessor, a controller or various other computing or processing devices including integrated circuits such as, for example, an ASIC (application specific integrated circuit), an FPGA, or the like. In an example embodiment, the control circuitry 610 may be configured to execute instructions stored in the memory 620 or otherwise accessible to the control circuitry 610. As such, whether configured by hardware or by a combination of hardware and software, the control circuitry 610 may represent an entity (e.g., physically embodied in circuitry—in the form of control circuitry 610) capable of performing operations according to example embodiments while configured accordingly. Thus, for example, when the control circuitry 610 is embodied as an ASIC, FPGA, or the like, the control circuitry 610 may be specifically configured hardware for conducting the operations described herein. Alternatively, as another example, when the control circuitry 610 is embodied as an executor of software instructions, the instructions may specifically configure the control circuitry 610 to perform the operations described herein.

In this regard, the control circuitry 610 may be connected to the SPAD microcell structures (e.g., via the common anode connections 230, 430, or 530 and the common cathode connections 240, 440, or 540) and configured to control the biasing of the SPAD array 650 and SPAD microcell structures of the SPAD array 650. For example, as described above, the control circuitry 610 may be configured to control a voltage applied to the common anode connection and the common cathode connection to maintain operation as a SPAD. In this regard, the voltages may be maintained as reverse-biased at a level above the breakdown voltages of the junctions. Further, according to some example embodiments, the control circuitry 610 may control the biasing voltage such that, when an avalanche event is detected, the control circuitry 610 may respond, for example, after a set time period, by reducing the bias voltage to extinguish the avalanche event and reset the SPAD array 650 for subsequent operations.

Further, according to some example embodiments, the control circuitry 610 may be configured to measure electrical characteristics of a signal provided on the output of the SPAD array 650. For example, the control circuitry 610 may count pulses received as an output from the SPAD array 650. In this regard, a pulse may be a sudden increase in voltage or current that increases at a rate faster than a threshold amount over a duration of time. In this regard, the control circuitry 610 may include a counter that counts the number of pulses received to permit further analysis to determine, for example, an estimate of the amount of energy that is present in the received ionizing radiation. In this regard, the magnitude of the pulse may have a proportional relationship with the magnitude of the energy in the received ionizing radiation. Further, the control circuitry 610 may include an sounder output to permit the pulses to be output in an audible manner, similar to a Geiger counter. According to some example embodiments, the discharge associated with an avalanche event for an excited SPAD microcell structure may produce a precise charge release (nominal is 0.5 pC) per excited SPAD microcell structure. As such, multiple discharges may create integer multiples of the base charge release improving the ability to detect and evaluate the signal due to the parallel connections with the SPAD microcell structures. Additionally, according to some example embodiments, the number of excited SPAD microcell structures may be proportional to the detected light. The detected light yield may therefore provide information on the incident radiation particle's energy. As such, the presence of radiation may be detected as well as the amount of energy from the emitting source, which may also indicate a type of source (e.g., dirty bomb).

With respect to operation as a counter, the relationship that a number of collected pairs of electron-holes generated by the ionizing radiation may be proportional to the incident radiation energy can be utilized. The integrated charge release may therefore inform on the signal intensity. In this approach, each radiation interaction may lead to a large pulse, allowing the creation of an instrument similar to a Geiger counter in operationally practice.

The output from the SPAD array 650 may also be considered spectroscopic, in the sense that the number of excited microcells per event may increase with particle energy. Further, the electron drift and the resultant output signal may be modified or adapted by using different dopings with the SPAD microcell structure to encourage excitation of additional SPAD microcell structures.

As such, according to some example embodiments, the control circuitry 610 may be configured to control biasing of pluralities of SPAD microcell structures. Additionally, according to some example embodiments, the control circuitry 610 may be configured to measure electrical characteristics of a signal provided on the output of SPAD array 650. Further, the control circuitry 610 may be configured to determine an estimated energy in ionizing radiation based on the electrical characteristics of the signal provided on the output and measured by the control circuitry.

Figure 11:
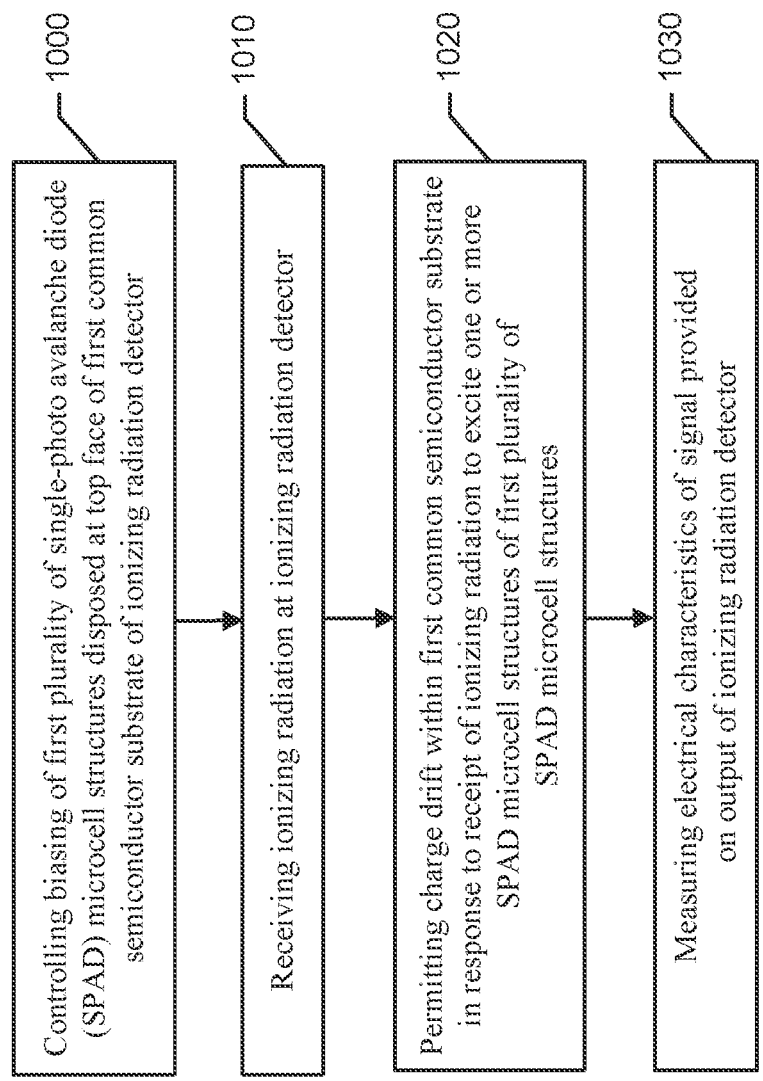
FIG. 11 illustrates a flowchart of a method associated with operation of a ionizing radiation detector according to some example embodiments.

Now referring to FIG. 11, an example method associated with operation of a ionizing radiation detector, according to some example embodiments, is provided. In this regard, at 1000, the example method may comprise controlling biasing of a first plurality of SPAD microcell structures disposed at a top face of a first common semiconductor substrate of an ionizing radiation detector. Each SPAD microcell structure of the first plurality of SPAD microcell structures may comprise a first semiconductor junction that is reverse-biased beyond a first breakdown threshold for the first semiconductor junction. The example method may also include receiving ionizing radiation at the ionizing radiation detector at 1010. Additionally, at 1020, the example method may comprise permitting charge drift within a first common semiconductor substrate in response to receipt of ionizing radiation to excite one or more of the SPAD microcell structures of a first plurality of SPAD microcell structures. In this regard, the charge drift may not be inhibited from exciting more than one of SPAD microcell structures of a first plurality of SPAD microcell structures by isolation barriers. Further, at 1030, the example method may comprise measuring electrical characteristics of a signal provided on an output. The output of the first plurality of SPAD microcell structures may comprise a common anode connection and a common cathode connection to each of the SPAD microcell structures of the first plurality of SPAD microcell structures.

Figure 12:
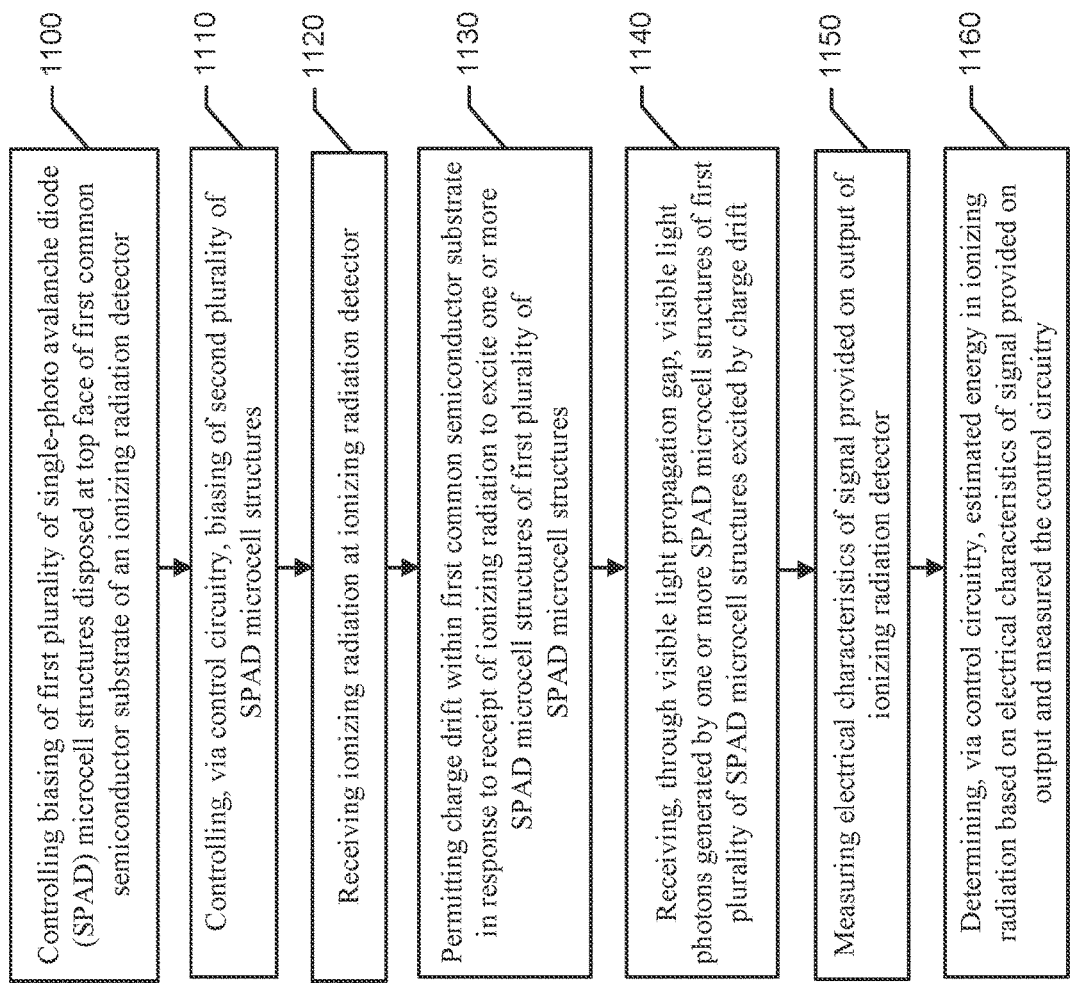
FIG. 12 illustrates a flowchart of a method associated with operation of a ionizing radiation detector according to some example embodiments.

Now referring to FIG. 12, another example embodiment in the form of an example method is provided. In this regard, the example method of FIG. 11 may include some of the operations described with respect to the example method of FIG. 10. Additionally, according to the example methods according to FIG. 12, the inclusion and operation of a second plurality of SPAD microcell structures is provided.

In this regard, at 1100, the example method may comprise controlling biasing of a first plurality of SPAD microcell structures disposed at a top face of a first common semiconductor substrate of an ionizing radiation detector. Each SPAD microcell structure of the first plurality of SPAD microcell structures may comprise a first semiconductor junction that is reverse-biased beyond a first breakdown threshold for the first semiconductor junction. Additionally, at 1110, the example method may comprise controlling, via the control circuitry, biasing of the second plurality of SPAD microcell structures. Each SPAD microcell structure of the second plurality of SPAD microcell structures may comprise a second semiconductor junction that is reverse-biased beyond a second breakdown threshold for the second semiconductor junction.

At 1120, the example method may comprise receiving ionizing radiation at the ionizing radiation detector. In response, the example method may also comprise permitting charge drift within a first common semiconductor substrate in response to receipt of ionizing radiation to excite one or more of the SPAD microcell structures of a first plurality of SPAD microcell structures. In this regard, the charge drift may not be inhibited from exciting more than one of SPAD microcell structures of a first plurality of SPAD microcell structures by isolation barriers. Further, at 1140, the example method may comprise receiving, through a visible light propagation gap, visible light photons generated by the one or more of the SPAD microcell structures of the first plurality of SPAD microcell structures that are excited by the charge drift. The visible light photons may be received by one or more of a second plurality of SPAD microcell structures disposed at a top face of a second common semiconductor substrate. Further, according to some example embodiments, the top face of the first common semiconductor substrate may be oriented in a first direction and the top face of the second common semiconductor substrate may be oriented in a second direction that is facing the top face of the first common semiconductor substrate. The visible light photons generated by excitation of the one or more of the first plurality of SPAD microcell structures need not be inhibited from propagating through the visible light propagation gap and cross talking to one or more of the second plurality of SPAD microcell structures by barriers or reflective members.

At 1150, the example method may comprise measuring electrical characteristics of a signal provided on a output. The output of the first plurality of SPAD microcell structures may comprise a common anode connection and a common cathode connection to each of the SPAD microcell structures of the first plurality of SPAD microcell structures. Additionally, at 1160, the example method may comprise determining, by the control circuitry, an estimated energy in the ionizing radiation based on the electrical characteristics of the signal provided on the output and measured by the control circuitry.

Additionally, with respect to either the example method of FIG. 10 or FIG. 11, the structural features of the SPAD structures in the first or second pluralities of SPAD may be further defined. In this regard, each of the SPAD microcell structures may comprises an n-doped region at the top face of the first or second common semiconductor substrate. This n-doped region may be disposed on a p-doped region within the first or second common semiconductor substrate. Alternatively, each of the SPAD microcell structures may comprise an p-doped region at the top face of the first or second common semiconductor substrate. This p-doped region may be disposed on a n-doped region within the first or second common semiconductor substrate.

Additional example embodiments are also provided that may include various alterations and modifications. In this regard, for example, an ionizing radiation detector is provided. The ionizing radiation detector may comprise a first common semiconductor substrate and a first plurality of photon avalanche diode SPAD microcell structures disposed at a top face of the first common semiconductor substrate. In this regard, each SPAD microcell structure of the first plurality of SPAD microcell structures may comprise a first semiconductor junction that is reverse-biased beyond a first breakdown threshold for the first semiconductor junction. The ionizing radiation detector may also comprise a common anode connection and a common cathode connection to each of the SPAD microcell structures of the first plurality of SPAD microcell structures. These connections may be configured to operate as an output. The ionizing radiation detector may also comprise control circuitry connected to the first plurality of SPAD microcell structures. The control circuitry may be configured to control biasing of the first plurality of SPAD microcell structures, and measure electrical characteristics of a signal provided on the output. According to some example embodiments, the charge drift within the first common semiconductor substrate need not be inhibited from exciting more than one of the SPAD microcell structures of the first plurality of SPAD microcell structures by isolation barriers.

Additionally, according to some example embodiments, each of the first plurality of SPAD microcell structures may comprise an n-doped region at the top face of the first common semiconductor substrate. The n-doped region may be disposed on a p-doped region.

Alternatively, each of the first plurality of SPAD microcell structures may comprise an p-doped region at the top face of the first common semiconductor substrate. The p-doped region may be disposed on a n-doped region.

Additionally, according to some example embodiments, a top face of the first common semiconductor substrate is oriented in a first direction. Further, the ionizing radiation detector may further comprise, according to some example embodiments, a second common semiconductor substrate and a second plurality of SPAD microcell structures disposed at a top face of the second common semiconductor substrate. In this regard, each SPAD microcell structure of the second plurality of SPAD microcell structures may comprise a second semiconductor junction that is reverse-biased beyond a second breakdown threshold for the second semiconductor junction. The top face of the second common semiconductor substrate may be oriented in a second direction that is facing the top face of the first common semiconductor substrate. The ionizing radiation detector may further comprise a visible light propagation gap between the top face of the first common semiconductor substrate and the top face of the second common semiconductor substrate. The common anode connection and the common cathode connection may be connected to each of the SPAD microcell structures of the second plurality of SPAD microcell structures.

Additionally or alternatively, according to some example embodiments, the control circuitry may be connected to the second plurality of SPAD microcell structures and configured to control biasing of the second plurality of SPAD microcell structures. According to some example embodiments, the visible light photons generated by excitation of one or more of the first plurality of SPAD microcell structures need not be inhibited from propagating through the visible light propagation gap and cross talking to one or more of the second plurality of SPAD microcell structures by barriers or reflective members. Additionally or alternatively, according to some example embodiments, the control circuitry is configured to determine an estimated energy in ionizing radiation based on the electrical characteristics of the signal provided on the output and measured by the control circuitry.

Another example embodiment is a SPAD array for an ionizing radiation detector. The SPAD array may comprise a first common semiconductor substrate, and a first plurality of SPAD microcell structures disposed at a top face of the first common semiconductor substrate. Each SPAD microcell structure of the first plurality of SPAD microcell structures may comprise a first semiconductor junction that is reverse-biased beyond a first breakdown threshold for the first semiconductor junction. The SPAD array may further comprise a common anode connection and a common cathode connection to each of the SPAD microcell structure of the first plurality of SPAD microcell structures and configured to operate as an output. Charge drift within the first common semiconductor substrate need not be inhibited from exciting more than one of the SPAD microcell structures of the first plurality of SPAD microcell structures by isolation barriers.

Additionally, according to some example embodiments, each of the first plurality of SPAD microcell structures may comprise an n-doped region at the top face of the first common semiconductor substrate. The n-doped region may be disposed on a p-doped region.

Alternatively, each of the first plurality of SPAD microcell structures may comprise an p-doped region at the top face of the first common semiconductor substrate. The p-doped region may be disposed on a n-doped region.

Further, according to some example embodiments, the top face of the first common semiconductor substrate may be oriented in a first direction. Additionally, the SPAD array may comprise a second common semiconductor substrate, and a second plurality of SPAD microcell structures disposed at a top face of the second common semiconductor substrate. Each SPAD microcell structure of the second plurality of SPAD microcell structures may comprise a second semiconductor junction that is reverse-biased beyond a second breakdown threshold for the second semiconductor junction. The top face of the second common semiconductor substrate may be oriented in a second direction that is facing the top face of the first common semiconductor substrate. The SPAD array may also comprise a visible light propagation gap between the top face of the first common semiconductor substrate and the top face of the second common semiconductor substrate. The common anode connection and the common cathode connection may be connected to each of the SPAD microcell structures of the second plurality of SPAD microcell structures. According to some example embodiments, visible light photons generated by excitation of one or more of the first plurality of SPAD microcell structures need not be inhibited from propagating through the visible light propagation gap and cross talking to one or more of the second plurality of SPAD microcell structures by barriers or reflective members. According to some example embodiments, the SPAD array may be configured to capture emitted visible light from the first plurality of SPAD microcell structures propagating in three dimensions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. An ionizing radiation detector comprising:
a first common semiconductor substrate;
a first plurality of single-photon avalanche diode (SPAD) microcell structures disposed at a top face of the first common semiconductor substrate, each SPAD microcell structure of the first plurality of SPAD microcell structures comprising a first semiconductor junction that is reverse-biased beyond a first breakdown threshold for the first semiconductor junction;
a second common semiconductor substrate;
a second plurality of SPAD microcell structures disposed at a top face of the second common semiconductor substrate, each SPAD microcell structure of the second plurality of SPAD microcell structures comprising a second semiconductor junction that is reverse-biased beyond a second breakdown threshold for the second semiconductor junction, the top face of the second common semiconductor substrate being oriented in a second direction that is facing the top face of the first common semiconductor substrate;
a visible light propagation gap between the top face of the first common semiconductor substrate and the top face of the second common semiconductor substrate;
a common anode connection and a common cathode connection to each of the SPAD microcell structures of the first plurality of SPAD microcell structures and configured to operate as an output; and
control circuitry connected to the first plurality of SPAD microcell structures and configured to:
control biasing of the first plurality of SPAD microcell structures; and
measure electrical characteristics of a signal provided on the output;
wherein charge drift within the first common semiconductor substrate is not inhibited from exciting more than one of the SPAD microcell structures of the first plurality of SPAD microcell structures by isolation barriers,
wherein the top face of the first common semiconductor substrate is oriented in a first direction, and
wherein the common anode connection and the common cathode connection are connected to each of the SPAD microcell structures of the second plurality of SPAD microcell structures.

2. The ionizing radiation detector of claim 1 wherein each of the first plurality of SPAD microcell structures comprises an n-doped region at the top face of the first common semiconductor substrate, the n-doped region being disposed on a p-doped region.

3. The ionizing radiation detector of claim 1 wherein each of the first plurality of SPAD microcell structures comprises an p-doped region at the top face of the first common semiconductor substrate, the p-doped region being disposed on a n-doped region.

4. The ionizing radiation detector of claim 1 wherein the control circuitry is connected to the second plurality of SPAD microcell structures and configured to control biasing of the second plurality of SPAD microcell structures.

5. The ionizing radiation detector of claim 1 wherein visible light photons generated by excitation of one or more of the first plurality of SPAD microcell structures are not inhibited from propagating through the visible light propagation gap and cross talking to one or more of the second plurality of SPAD microcell structures by barriers or reflective members.

6. The ionizing radiation detector of claim 5, wherein the control circuitry is configured to determine an estimated energy in ionizing radiation based on the measured electrical characteristics of the signal provided on the output and measured by the control circuitry.

7. A single-photon avalanche diode (SPAD) array for an ionizing radiation detector comprising:
   a first common semiconductor substrate;
   a first plurality of SPAD microcell structures disposed at a top face of the first common semiconductor substrate, each SPAD microcell structure of the first plurality of SPAD microcell structures comprising a first semiconductor junction that is reverse-biased beyond a first breakdown threshold for the first semiconductor junction;
   a second common semiconductor substrate;
   a second plurality of SPAD microcell structures disposed at a top face of the second common semiconductor substrate, each SPAD microcell structure of the second plurality of SPAD microcell structures comprising a second semiconductor junction that is reverse-biased beyond a second breakdown threshold for the second semiconductor junction, the top face of the second common semiconductor substrate being oriented in a second direction that is facing the top face of the first common semiconductor substrate;
   a visible light propagation gap between the top face of the first common semiconductor substrate and the top face of the second common semiconductor substrate; and
   a common anode connection and a common cathode connection to each of the SPAD microcell structure of the first plurality of SPAD microcell structures and configured to operate as an output for the SPAD array,
   wherein charge drift within the first common semiconductor substrate is not inhibited from exciting more than one of the SPAD microcell structures of the first plurality of SPAD microcell structures by isolation barriers,
   wherein the top face of the first common semiconductor substrate is oriented in a first direction, and
   wherein the common anode connection and the common cathode connection are connected to each of the SPAD microcell structures of the second plurality of SPAD microcell structures.

8. The SPAD array of claim 7 wherein each of the first plurality of SPAD microcell structures comprises an n-doped region at the top face of the first common semiconductor substrate, the n-doped region being disposed on a p-doped region.

9. The SPAD array of claim 7 wherein each of the first plurality of SPAD microcell structures comprises an p-doped region at the top face of the first common semiconductor substrate, the p-doped region being disposed on a n-doped region.

10. The SPAD array of claim 7 wherein visible light photons generated by excitation of one or more of the first plurality of SPAD microcell structures are not inhibited from propagating through the visible light propagation gap and cross talking to one or more of the second plurality of SPAD microcell structures by barriers or reflective members.

11. The SPAD array of claim 7 wherein the SPAD array is configured to capture emitted visible light from the first plurality of SPAD microcell structures propagating in three dimensions.

12. A method comprising:
   controlling biasing of a first plurality of single-photon avalanche diode (SPAD) microcell structures disposed at a top face of a first common semiconductor substrate of an ionizing radiation detector, each SPAD microcell structure of the first plurality of SPAD microcell structures comprising a first semiconductor junction that is reverse-biased beyond a first breakdown threshold for the first semiconductor junction;
   receiving ionizing radiation at the ionizing radiation detector;
   permitting charge drift within a first common semiconductor substrate in response to receipt of ionizing radiation to excite one or more of the SPAD microcell structures of a first plurality of SPAD microcell structures, wherein the charge drift is not inhibited from exciting more than one of SPAD microcell structures of a first plurality of SPAD microcell structures by isolation barriers;
   measuring electrical characteristics of a signal provided on an output, the output being a common anode connection and a common cathode connection to each of the SPAD microcell structures of the first plurality of SPAD microcell structures; and
   receiving, through a visible light propagation gap, visible light photons generated by the one or more of the SPAD microcell structures of the first plurality of SPAD microcell structures that are excited by the charge drift, the visible light photons being received by one or more of a second plurality of SPAD microcell structures disposed at a top face of a second common semiconductor substrate, each SPAD microcell structure of the second plurality of SPAD microcell structures comprising a second semiconductor junction that is reverse-biased beyond a breakdown threshold for the second semiconductor junction,
   wherein the top face of the first common semiconductor substrate is oriented in a first direction and the top face of the second common semiconductor substrate is oriented in a second direction that is facing the top face of the first common semiconductor substrate.

13. The method of claim 12 wherein each of the first plurality of SPAD microcell structures comprises an n-doped region at the top face of the first common semiconductor substrate, the n-doped region being disposed on a p-doped region.

14. The method of claim 12 wherein each of the first plurality of SPAD microcell structures comprises an p-doped region at the top face of the first common semiconductor substrate, the p-doped region being disposed on a n-doped region.

15. The method of claim 12 further comprising controlling, via control circuitry, biasing of the second plurality of SPAD microcell structures.

16. The method of claim 12 wherein visible light photons generated by excitation of the one or more of the first plurality of SPAD microcell structures are not inhibited from propagating through the visible light propagation gap and cross talking to one or more of the second plurality of SPAD microcell structures by barriers or reflective members.

17. The method of claim 12 further comprising determining, by control circuitry, an estimated energy in the received ionizing radiation based on the electrical characteristics of the signal provided on the output and measured by the control circuitry.

* * * * *